(12) United States Patent
Chen et al.

(10) Patent No.: US 10,892,323 B2
(45) Date of Patent: Jan. 12, 2021

(54) SEMICONDUCTOR STRUCTURE AND MANUFACTURING METHOD THEREOF

(71) Applicant: Winbond Electronics Corp., Taichung (TW)

(72) Inventors: Huang-Nan Chen, Taichung (TW); Ming-Chih Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 98 days.

(21) Appl. No.: 16/419,021

(22) Filed: May 22, 2019

(65) Prior Publication Data

US 2020/0373386 A1 Nov. 26, 2020

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 29/06* | (2006.01) | |
| *H01L 21/033* | (2006.01) | |
| *H01L 21/762* | (2006.01) | |
| *H01L 27/108* | (2006.01) | |

(52) U.S. Cl.
CPC ...... *H01L 29/0653* (2013.01); *H01L 21/0337* (2013.01); *H01L 21/762* (2013.01); *H01L 27/10823* (2013.01); *H01L 27/10891* (2013.01)

(58) Field of Classification Search
CPC ......... H01L 29/0653; H01L 21/823437; H01L 21/762; H01L 27/10897; H01L 27/11551; H01L 27/1255; H01L 27/228; H01L 21/0332; H01L 21/0337; H01L 21/0338; H01L 27/1052; H01L 27/10823; H01L 27/10888; H01L 27/10891; H01L 27/11529
USPC ........................................................ 257/401
See application file for complete search history.

(56) References Cited

U.S. PATENT DOCUMENTS 8,735,267 B1 5/2014 Park et al.
2020/0027884 A1* 1/2020 Chuang ............. H01L 27/10814

FOREIGN PATENT DOCUMENTS

KR 20060038595 5/2006
KR 100672780 1/2007

* cited by examiner

*Primary Examiner* — Theresa T Doan
(74) *Attorney, Agent, or Firm* — JCIPRNET (57) ABSTRACT

A buried word line structure including a substrate, an isolation structure, and a buried word line is provided. The isolation structure is located in the substrate to define active regions separated from each other. The active regions extend in a first direction. The buried word line is located in the substrate. The buried word line extends through the isolation structure and the active regions in a second direction. The first direction intersects the second direction. The buried word line and the substrate are isolated from each other. The same buried word line includes a first portion and a second portion. The first portion is located in the active regions. The second portion is located in the isolation structure between two adjacent active regions in the first direction. A width of the first portion is greater than a width of the second portion.

20 Claims, 11 Drawing Sheets

SEMICONDUCTOR STRUCTURE AND MANUFACTURING METHOD THEREOF

BACKGROUND OF THE INVENTION

Field of the Invention

The invention relates to a semiconductor structure, and particularly relates to a buried word line structure.

Description of Related Art

In general, the buried word line extends through the active region and the isolation structure. However, when the word line is shifted, the buried word line which should be located in the isolation structure is shifted to the outside of the isolation structure, and the leakage current is generated between the buried word line and the active region.

SUMMARY OF THE INVENTION

The invention provides a buried word line structure, which can effectively prevents leakage current from being generated between the buried word line and the active region.

The invention provides a buried word line structure, which includes a substrate, an isolation structure, and a buried word line. The isolation structure is located in the substrate to define active regions separated from each other. The active regions extend in a first direction. The buried word line is located in the substrate. The buried word line extends through the isolation structure and the active regions in a second direction. The first direction intersects the second direction. The buried word line and the substrate are isolated from each other. The same buried word line includes a first portion and a second portion. The first portion is located in the active regions. The second portion is located in the isolation structure between two adjacent active regions in the first direction. The width of the first portion is greater than the width of the second portion.

Based on the above, in the buried word line structure according to the invention, since the second portion of the buried word line is located in the isolation structure between two adjacent active regions in the first direction and has a narrower width, the overlap margin between the second portion of the buried word line and the isolation structure can be effectively increased. Therefore, when the buried word line is shifted, the second portion of the buried word line can be prevented from shifting to the outside of the isolation structure, thereby preventing leakage current from being generated between the buried word line and the active region.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1K are top views illustrating a manufacturing process of a buried word line structure according to an embodiment of the invention. FIG. 2A to FIG. 2K are cross-sectional views taken along section line I-I' in FIG. 1A to FIG. 1K. In FIG. 1A to FIG. 1K, some of the components in FIG. 2A to FIG. 2K are omitted to clearly describe the arrangement relationship of the remaining components with respect to the isolation structure and the active region. For example, in FIG. 1A, a mask layer 104, a mask layer 106, a mask layer 108, and a mask layer 110 in FIG. 2A are omitted.

Figure 1A:
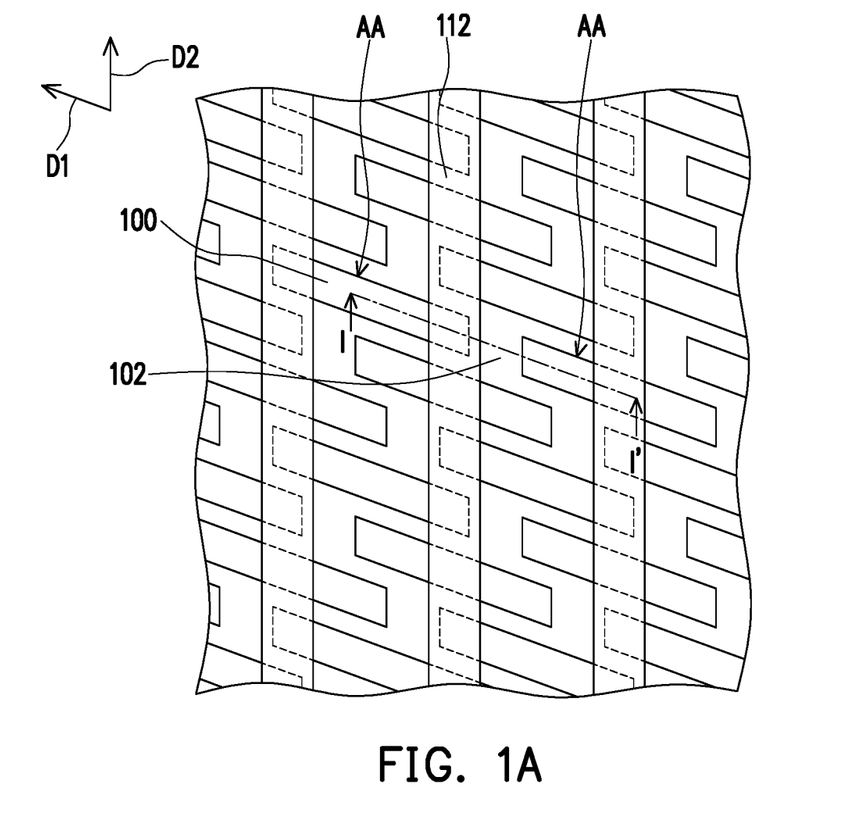
FIG. 1A to FIG. 1K are top views illustrating a manufacturing process of a buried word line structure according to an embodiment of the invention.
Figure 2A:
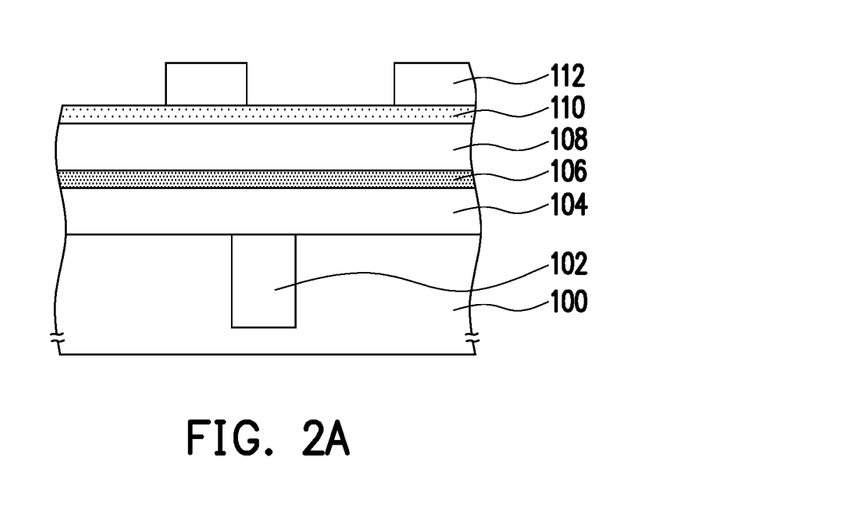
FIG. 2A to FIG. 2K are cross-sectional views taken along section line I-I' in FIG. 1A to FIG. 1K.

Referring to FIG. 1A and FIG. 2A, an isolation structure 102 is formed in a substrate 100 to define active regions AA separated from each other. The substrate 100 may be a semiconductor substrate, such as a silicon substrate. The isolation structure 102 is, for example, a shallow trench isolation (STI) structure. The material of the isolation structure 102 is, for example, silicon nitride or silicon oxide. In the present embodiment, the material of the isolation structure 102 is exemplified by silicon nitride.

Furthermore, the active regions AA extend in the first direction D1. The active regions AA may be arranged along a first direction D1. The active regions AA may be misaligned in a second direction D2. The first direction D1 intersects the second direction D2. A top view shape of each of the active regions AA is, for example, a parallelogram, but the invention is not limited thereto. Moreover, the first direction D1 may be parallel to the long side of the active region AA, and the second direction D2 may be parallel to the short side of the active region AA.

A mask layer 104, a mask layer 106, a mask layer 108, and a mask layer 110 are sequentially formed on the substrate 100. The material of the mask layer 104 is, for example, diamond-like carbon (DLC). The material of the mask layer 106 is, for example, nitrogen-rich silicon oxynitride (SiON—N). The material of the mask layer 108 is, for example, silicon oxide. The material of the mask layer 110 is, for example, oxygen-rich silicon oxynitride (SiON—O). However, the invention is not limited thereto.

A patterned mask layer 112 is formed on the mask layer 110. The patterned mask layer 112 may extend in the second direction. The material of the patterned mask layer 112 is, for example, polysilicon, silicon oxide, silicon nitride, carbon, or silicon oxynitride. The patterned mask layer 112 may be formed by performing a deposition process, a lithography process, and an etching process.

Figure 1B:
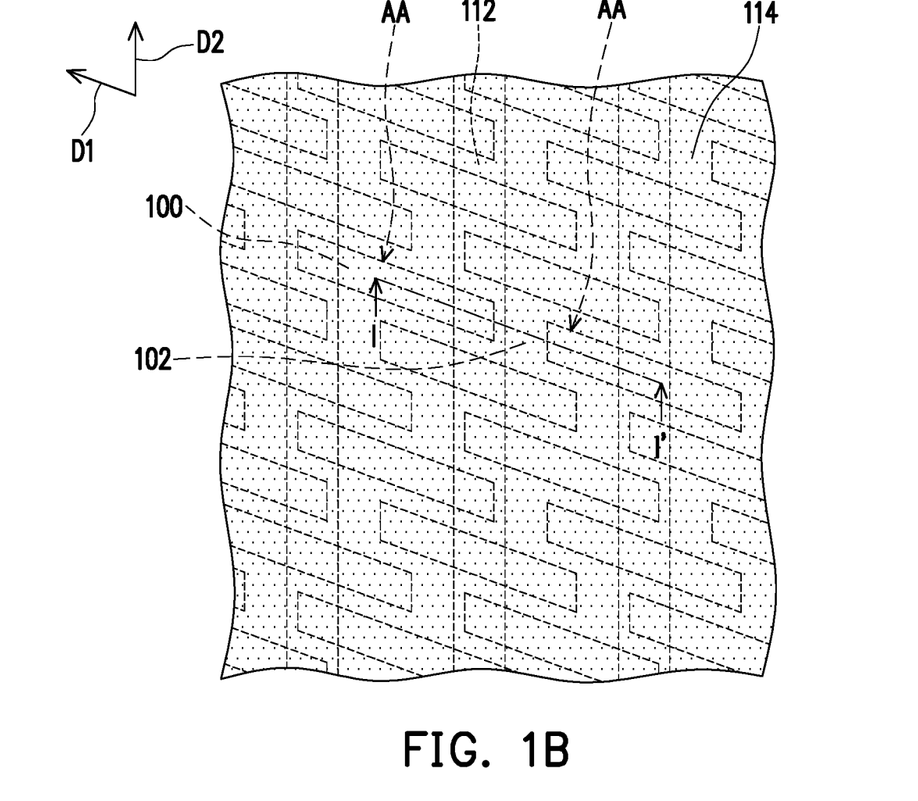
Figure 2B:
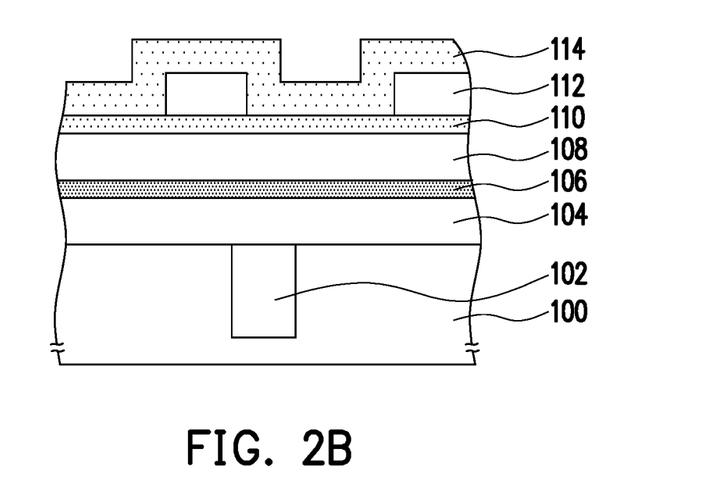

Referring to FIG. 1B and FIG. 2B, a spacer layer 114 is formed on the mask layer 110 and the patterned mask layer 112. The spacer layer 114 may be conformally formed on the patterned mask layer 112. The material of the spacer layer 114 is, for example, silicon oxide.

Figure 1C:
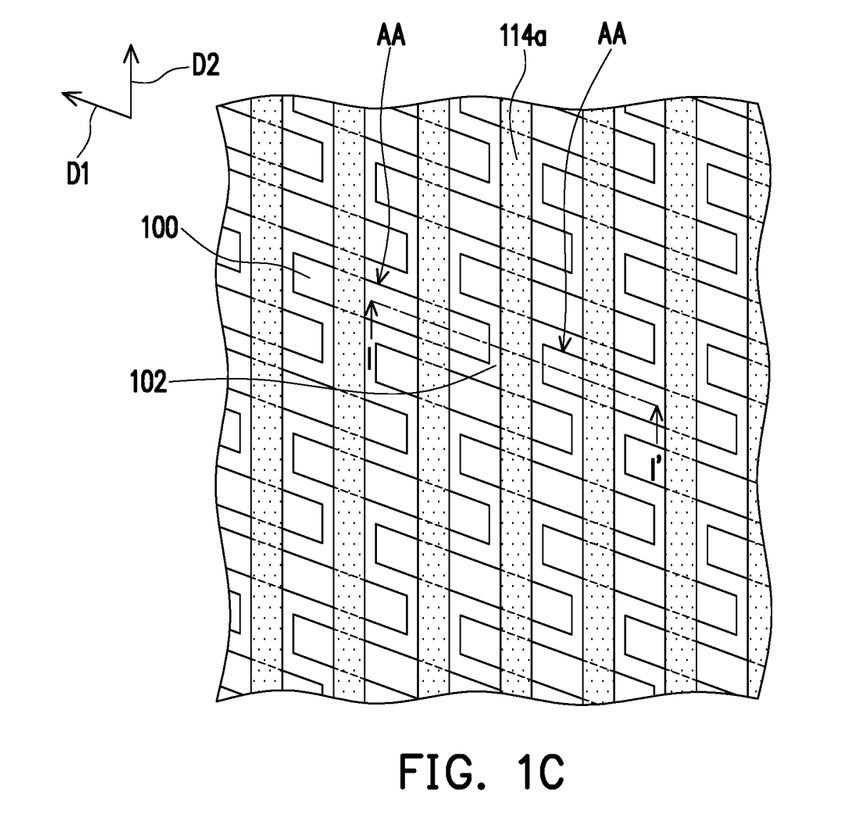
Figure 2C:
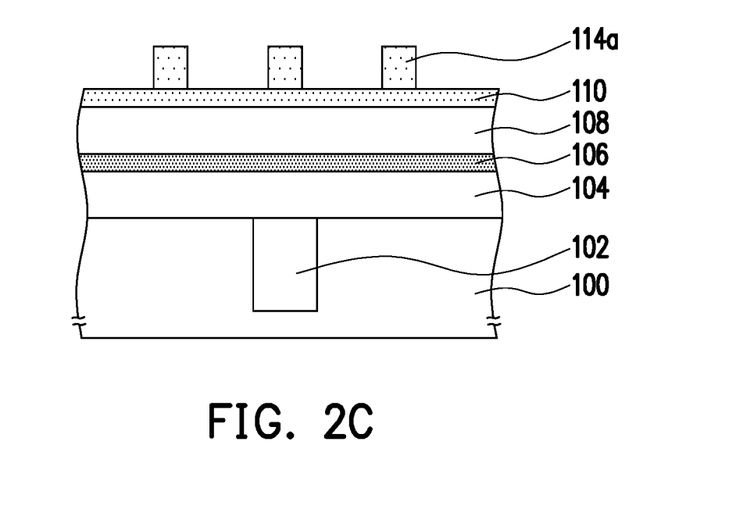

Referring to FIG. 1C and FIG. 2C, an etching back process is performed on the spacer layer 114 to form a spacer 114a on the sidewall of the patterned mask layer 112. The patterned mask layer 112 is removed.

Figure 1D:
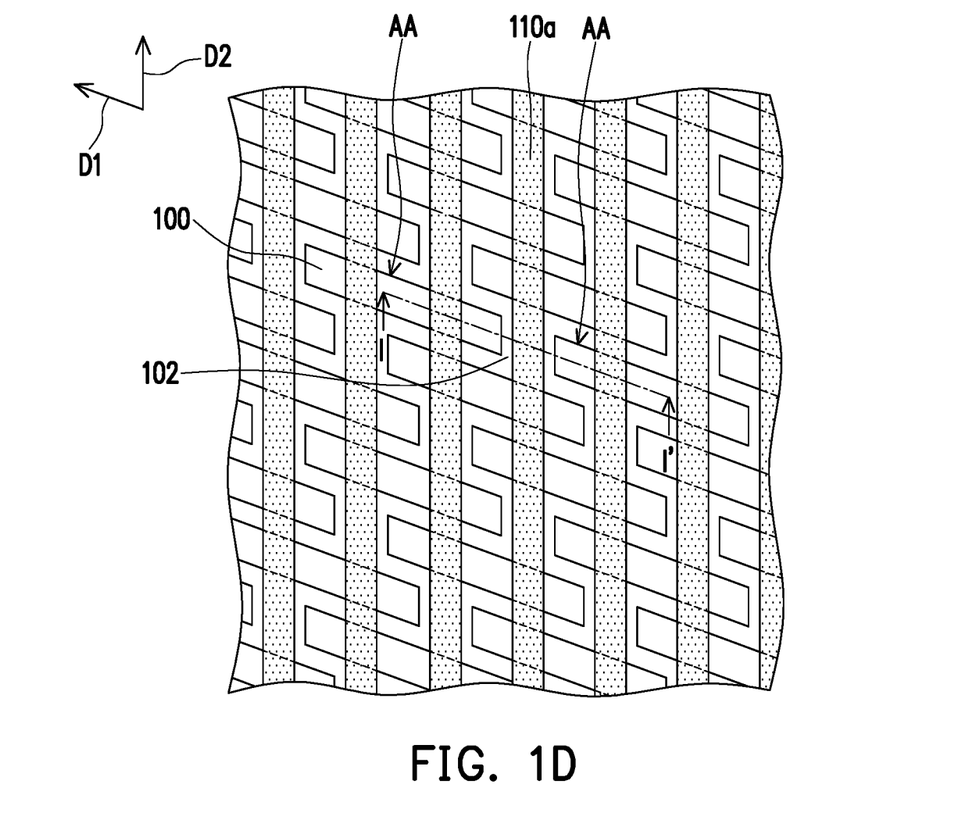
Figure 2D:
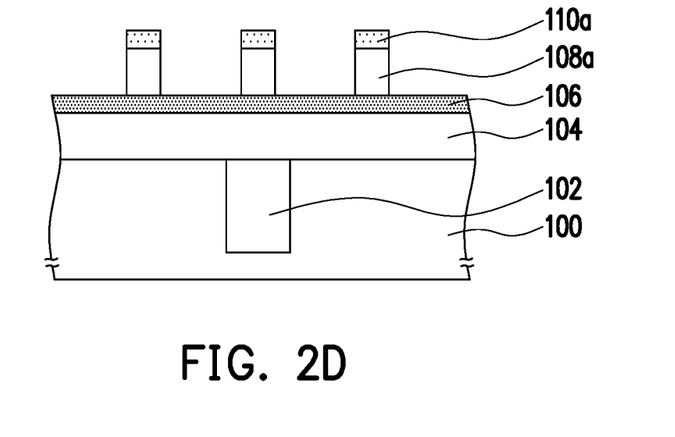

Referring to FIG. 1D and FIG. 2D, a portion of mask layer 110 is removed to form a mask layer 110a by using the spacer 114a as a mask. A portion of the mask layer 108 is removed to form a mask layer 108a by using the spacer 114a and the mask layer 110a as a mask. Furthermore, in the process of removing the portion of the mask layer 108, the spacer 114a may be simultaneously removed.

Figure 1E:
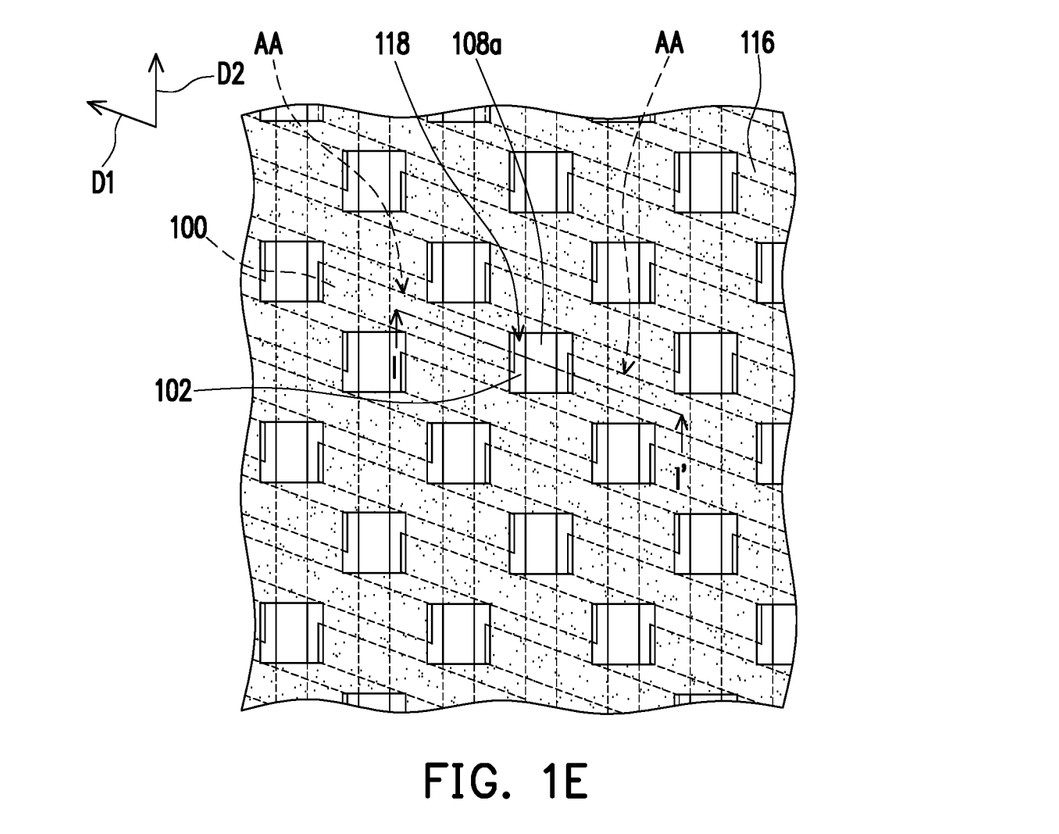
Figure 2E:
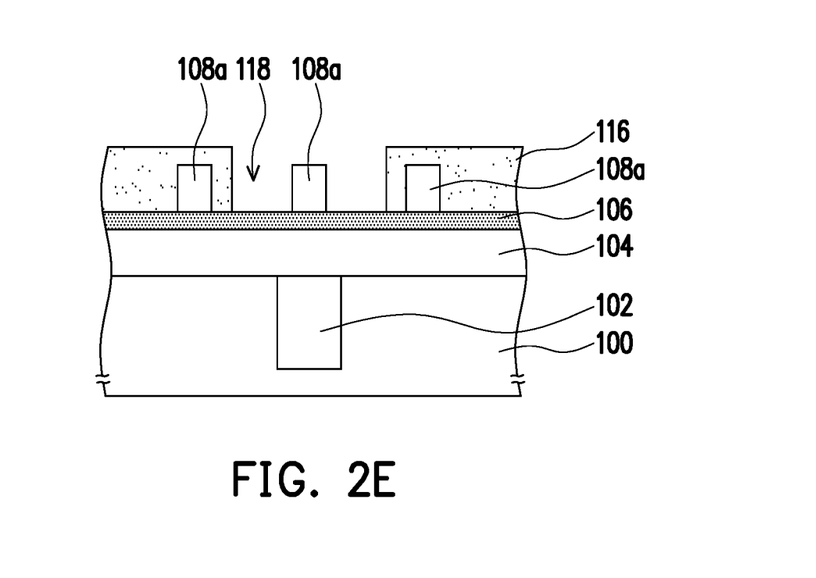

Referring to FIG. 1E and FIG. 2E, the mask layer 110a is removed. The mask layer 110a may be removed by a wet etching process. Moreover, since the wet etching process has high etching selectivity ratio of the mask layer 110a to the mask layer 106, the mask layer 110a may be removed by the wet etching process, and the mask layer 106 may be retained.

A patterned photoresist layer 116 is formed. The patterned photoresist layer 116 has an opening 118, and the opening 118 exposes the mask layer 108a located between two adjacent active regions AA in the first direction D1.

Figure 1F:
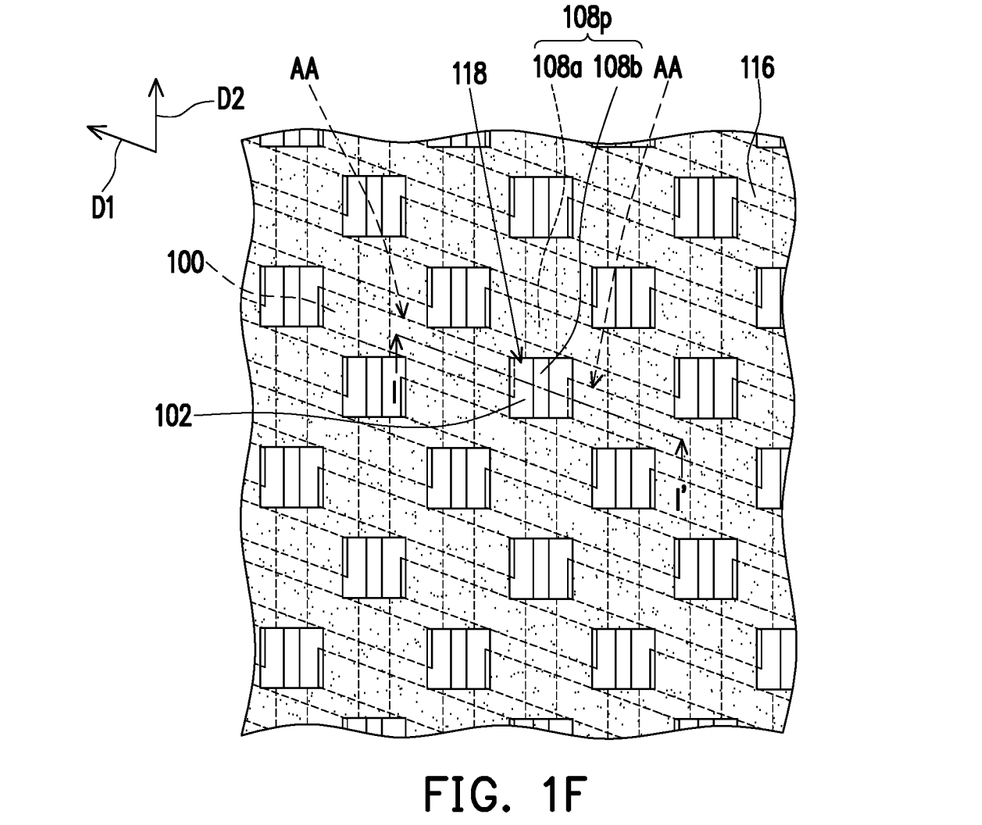
Figure 2F:
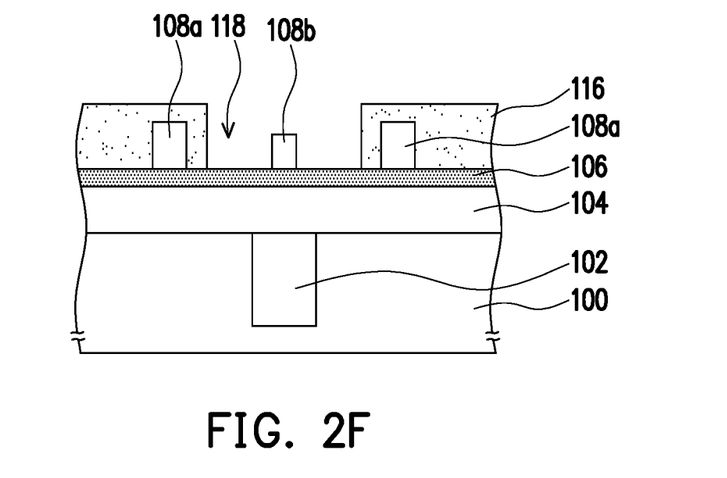

Referring to FIG. 1F and FIG. 2F, a wet etching process is performed on the mask layer 108a exposed by the opening 118 to form a mask layer 108b. The mask layer 108a and the mask layer 108b located in the second direction D2 may form a mask pattern 108p. The mask pattern 108p may extend in the second direction D2. The same mask pattern 108p may include the mask layer 108a and the mask layer 108b. The mask layer 108a may be located in the active region AA. The mask layer 108b may be located between two adjacent active regions AA in the first direction D1. The width of the mask layer 108a may be greater than the width of the mask layer 108b. The height of the mask layer 108a may be higher than the height of the mask layer 108b. The top view shape of the mask pattern 108p is, for example, a chain shape having a thick portion and a thin portion alternately arranged. The etchant used in the wet etching process is, for example, buffer hydrofluoric acid (BHF) or diluted hydrofluoric acid (DHF).

Figure 1G:
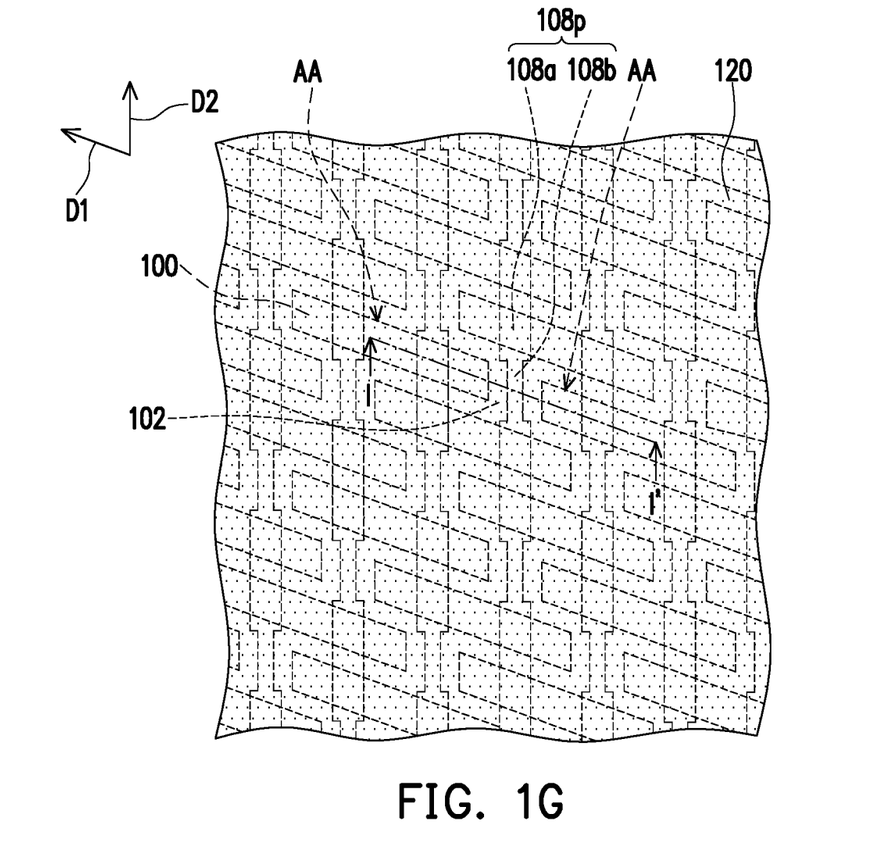
Figure 2G:
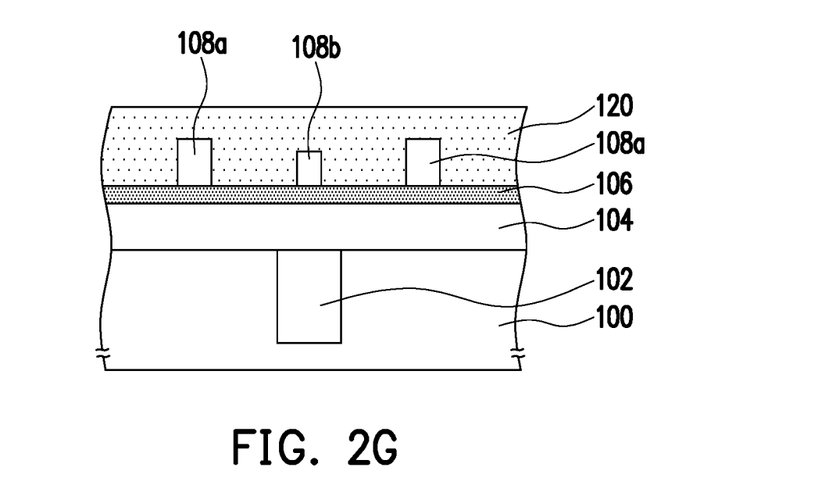

Referring to FIG. 1G and FIG. 2G, the patterned photoresist layer 116 is removed. A mask layer 120 covering the mask layer 108a and the mask layer 108b is formed. The material of the mask layer 120 is, for example, polysilicon.

Figure 1H:
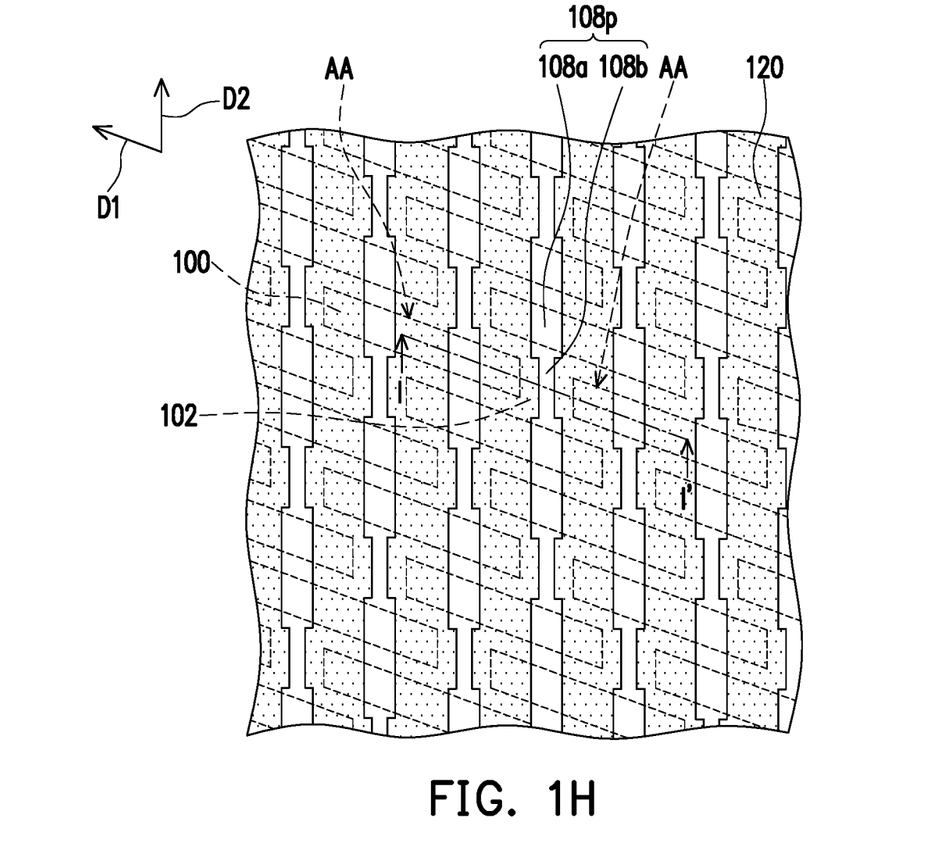
Figure 2H:
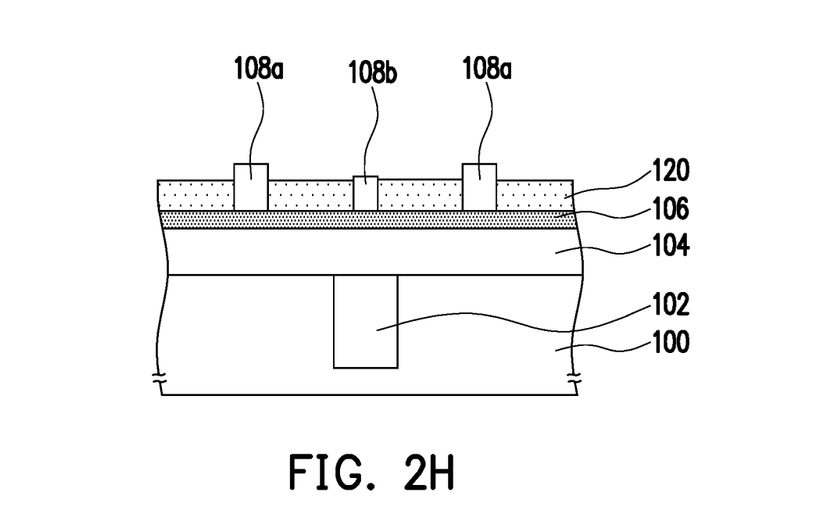

Referring to FIG. 1H and FIG. 2H, an etching back process is performed on the mask layer 120 to remove a portion of the mask layer 120 until the mask layer 108a and the mask layer 108b are exposed.

Figure 1I:
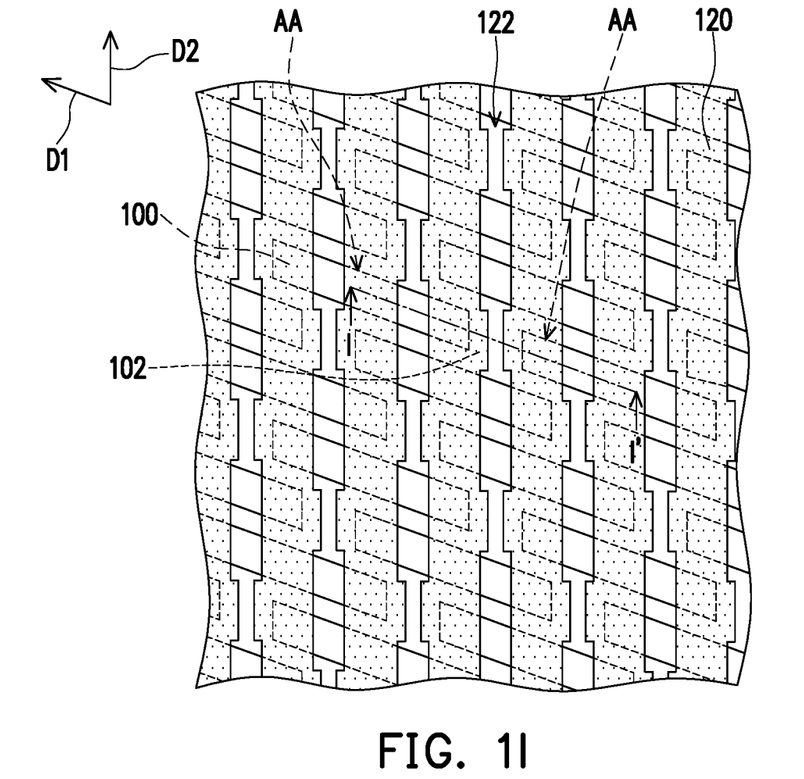
Figure 2I:
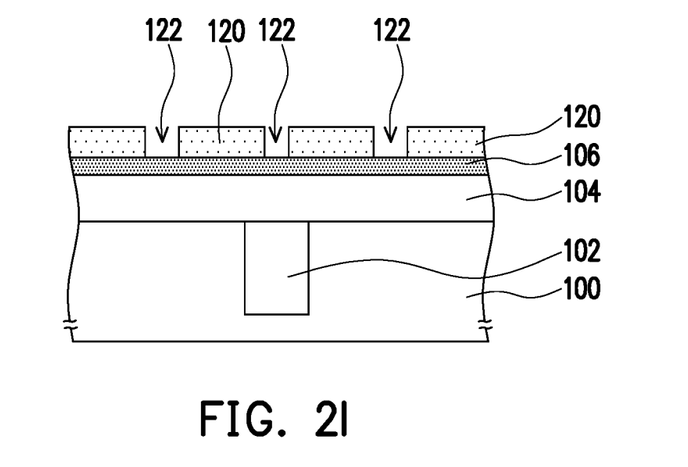

Referring to FIG. 1I and FIG. 2I, the mask layer 108a and the mask layer 108b are removed to form an opening 122 in the mask layer 120. The opening 122 may extend in the second direction D2. Since the opening 122 is formed by removing the mask layer 108a and the mask layer 108b, the pattern of the mask pattern 108p may be transferred to the opening 122.

Figure 1J:
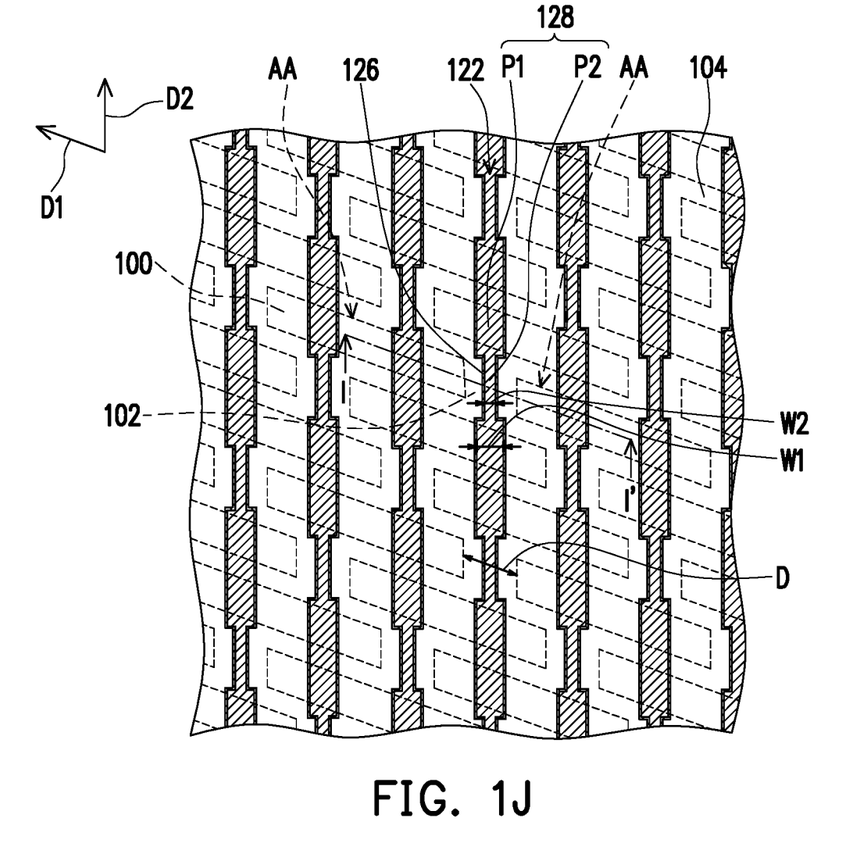
Figure 2J:
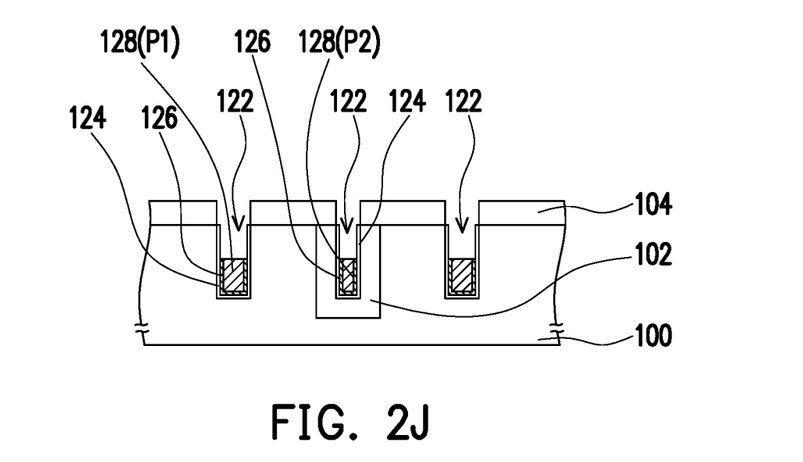

Referring to FIG. 1J and FIG. 2J, the opening 122 in the mask layer 120 is extended into the substrate 100 and the isolation structure 102. For example, the method of extending the opening 122 to the substrate 100 and the isolation structure 102 may include the following steps, but the invention is not limited thereto. Using the mask layer 120 as a mask, the mask layer 106 and the mask layer 104 are patterned by removing a portion of the mask layer 106 and a portion of the mask layer 104 by a dry etching method. The mask layer 120 may be simultaneously removed in the process of patterning the mask layer 106 and the mask layer 104 or removed by another etching process. The mask layer 106 is removed by a wet etching method. Using the patterned mask layer 104 as a mask, a portion of the substrate 100 and a portion of the isolation structure 102 are removed by a dry etching method to extend the opening 122 into the substrate 100 and the isolation structure 102.

A dielectric layer 124 is formed on the surface of the substrate 100 in the opening 122. The material of the dielectric layer 124 is, for example, silicon oxide. The method of forming the dielectric layer 124 is, for example, an in-situ steam generation (ISSG).

A barrier layer 126 and a buried word line 128 are formed in the opening 122. The method of forming the barrier layer 126 and the buried word line 128 may include the following steps, but the invention is not limited thereto. A barrier material layer (not shown) may be conformally formed in opening 122. A buried word line material layer (not shown) filling up the opening 122 is formed on the barrier material layer. An etching back process is performed on the buried word line material layer and the barrier material layer to form the barrier layer 126 and the buried word line 128 in the opening 122. In the above etching back process, the mask layer 104 can be used to protect the substrate 100, thereby avoiding damage to the substrate 100.

The barrier layer 126 is located between the buried word line 128 and the dielectric layer 124. The top portion of barrier layer 126 may be lower than the top portion of substrate 100. The material of barrier layer 126 is, for example, Ti, TiN, Ta, TaN, or a combination thereof.

The buried word line 128 extends through the isolation structure 102 and the active regions AA in the second direction D2. The material of the buried word line 128 may be a conductive material. For example, the material of the buried word line 128 is, for example, a metal such as tungsten. The buried word line 128 and the substitute 100 are isolated from each other. The same buried word line 128 includes a first portion P1 and a second portion P2. The first portion P1 is located in the active regions AA. The second portion P2 is located in the isolation structure 102 between two adjacent active regions AA in the first direction D1. The width W1 of the first portion P1 is greater than the width W2 of the second portion P2. The first portion P1 and the second portion P2 may be connected into a string in the second direction D2. The top view shape of the buried word line 128 is, for example, a chain shape having a thick portion and a thin portion alternately arranged, but the invention is not limited thereto. The width W2 of the second portion P2 may be smaller than a distance D between two adjacent active regions AA in the first direction D1. The width W1 of the first portion P1 may be smaller than the distance D between two adjacent active regions AA in the first direction D1. The top portion of the buried word line 128 may be lower than the top portion of the substrate 100.

Furthermore, the dielectric layer 124 is located between the buried word line 128 and the substitute 100, whereby the buried word line 128 can be isolated from the substitute 100. The top portion of the dielectric layer 124 may be higher than the top portion of the buried word line 128.

Figure 1K:
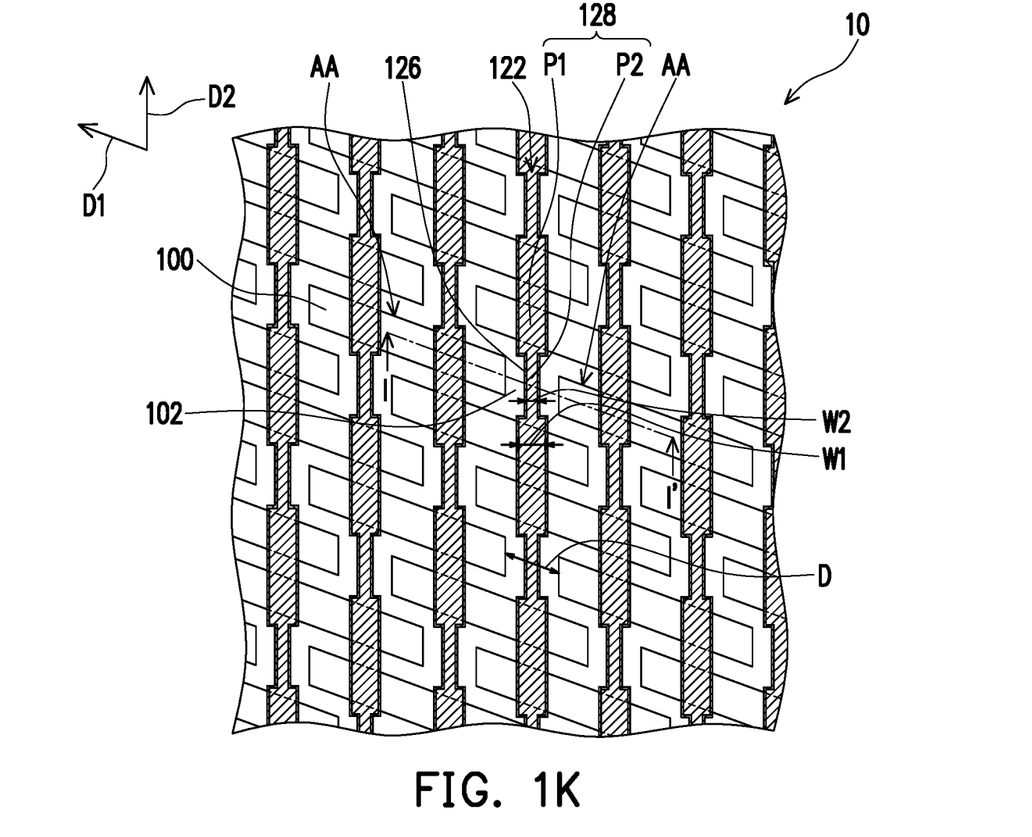
Figure 2K:
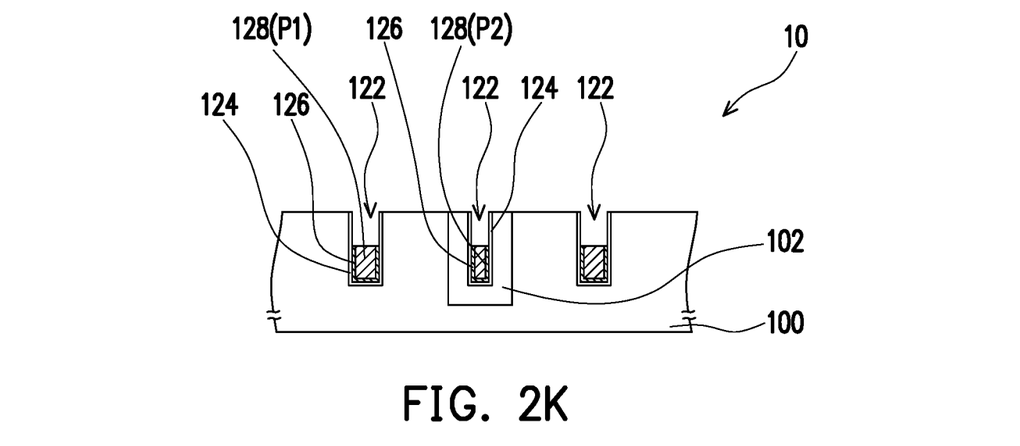

Referring to FIG. 1K and FIG. 2K, after the buried word line 128 is formed, the mask layer 104 may be removed. The mask layer 104 may be removed by using an ashing treatment or an etching process.

Hereinafter, the buried word line structure 10 of the present embodiment is described with reference to FIG. 1K and FIG. 2K. In addition, although the method of forming the buried word line structure 10 is described by taking the above method as an example, the invention is not limited thereto.

Referring to FIG. 1K and FIG. 2K, the buried word line structure 10 includes a substrate 100, an isolation structure 102, and a buried word line 128. The buried word line structure 10 may further include at least one of a dielectric layer 124 and a barrier layer 126. The buried word line structure 10 may be applied to various semiconductor devices such as a dynamic random access memory (DRAM). The isolation structure 102 is located in the substrate 100 to define the active regions AA separated from each other. The active regions AA extend in a first direction D1. The buried word line 128 is located in the substrate 100. The buried word line 128 extends through the isolation structure 102 and the active regions AA in a second direction D2. The first direction D1 intersects the second direction D2. The buried word line 128 and the substitute 100 are isolated from each other. The same buried word line 128 includes a first portion P1 and a second portion P2. The first portion P1 is located in the active regions AA. The second portion P2 is located in the isolation structure 102 between two adjacent active regions AA in the first direction D1. The width W1 of the first portion P1 is greater than the width W2 of the second portion P2. The dielectric layer 124 is located between the buried word line 128 and the substitute 100. The barrier layer 126 is located between the buried word line 128 and the electric layer 124. Furthermore, the material, the arrangement, the forming method, and the efficacy of each component in the buried word line structure 10 have been described in detail in the aforementioned embodiments, and the description thereof are not repeated here.

Based on the aforementioned embodiment, in the buried word line structure 10, since the second portion P2 of the buried word line 128 is located in the isolation structure 102 between two adjacent active regions AA in the first direction D1 and has a narrower width, the overlay margin between the second portion P2 of the buried word line 128 and the isolation structure 102 can be effectively increased. Therefore, when the buried word line 128 is shifted, the second portion P2 of the buried word line 128 can be prevented from shifting to the outside of the isolation structure 102, thereby preventing leakage current from being generated between the buried word line 128 and the active region AA.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A buried word line structure, comprising:
   a substrate;
   an isolation structure located in the substrate to define active regions separated from each other, wherein the active regions extend in a first direction; and
   a buried word line located in the substrate and extending through the isolation structure and the active regions in a second direction, wherein the first direction intersects the second direction, the buried word line and the substrate are isolated from each other, and
   the same word line comprises a first portion and a second portion, wherein the first portion is located in the active regions, the second portion is located in the isolation structure between two adjacent active regions in the first direction, and a width of the first portion is greater than a width of the second portion.

2. The buried word line structure according to claim 1, wherein the substrate comprises a semiconductor substrate.

3. The buried word line structure according to claim 1, wherein the isolation structure comprises a shallow trench isolation structure.

4. The buried word line structure according to claim 1, wherein a material of the isolation structure comprises silicon nitride or silicon oxide.

5. The buried word line structure according to claim 1, wherein the active regions are arranged along the first direction.

6. The buried word line structure according to claim 1, wherein the active regions are misaligned in the second direction.

7. The buried word line structure according to claim 1, wherein a top view shape of each of the active regions comprises a parallelogram.

8. The buried word line structure according to claim 1, wherein a top portion of the buried word line is lower than a top portion of the substrate.

9. The buried word line structure according to claim 1, wherein a material of the buried word line comprises a conductive material.

10. The buried word line structure according to claim 9, wherein the conductive material comprises a metal.

11. The buried word line structure according to claim 1, wherein the first portion and the second portion are connected into a string in the second direction.

12. The buried word line structure according to claim 11, wherein a top view shape of the buried word line comprises a chain shape having a thick portion and a thin portion alternately arranged.

13. The buried word line structure according to claim 1, wherein the width of the second portion is smaller than a distance between the two adjacent active regions in the first direction.

14. The buried word line structure according to claim 1, wherein the width of the first portion is smaller than a distance between the two adjacent active regions in the first direction.

15. The buried word line structure according to claim 1, further comprising:
    a dielectric layer located between the buried word line and the substrate.

16. The buried word line structure according to claim 15, wherein a top portion of the dielectric layer is higher than a top portion of the buried word line.

17. The buried word line structure according to claim 15, wherein a material of the dielectric layer comprises silicon oxide.

18. The buried word line structure according to claim 15, further comprising:
    a barrier layer located between the buried word line and the dielectric layer.

19. The buried word line structure according to claim 18, wherein a top portion of the barrier layer is lower than a top portion of the substrate.

20. The buried word line structure according to claim 18, wherein a material of the barrier layer comprises Ti, TiN, Ta, TaN or a combination thereof.

* * * * *